(12) United States Patent
Yang et al.

(10) Patent No.: US 9,612,288 B2
(45) Date of Patent: Apr. 4, 2017

(54) VOLTAGE-BASED FUEL GAUGE ON BATTERY CAPACITY

(71) Applicant: Analog Devices Global, Hamilton (BM)

(72) Inventors: Hua-Jung Yang, Santa Clara, CA (US); Janne Klemetti, Oulu (FI)

(73) Assignee: Analog Devices Global, Hamilton (BM)

( * ) Notice: Subject to any disclaimer, the term of this patent is extended or adjusted under 35 U.S.C. 154(b) by 109 days.

(21) Appl. No.: 14/169,667

(22) Filed: Jan. 31, 2014

(65) Prior Publication Data

US 2015/0219721 A1    Aug. 6, 2015

(51) Int. Cl.
  *H02J 7/00* (2006.01)
  *H02J 7/14* (2006.01)
  *G01R 31/36* (2006.01)

(52) U.S. Cl.
  CPC ..... *G01R 31/3651* (2013.01); *G01R 31/3624* (2013.01); *H02J 7/0021* (2013.01); *G01R 31/3675* (2013.01); *H02J 7/0016* (2013.01); *H02J 7/0031* (2013.01); *H02J 7/0036* (2013.01); *H02J 7/0073* (2013.01)

(58) Field of Classification Search
  USPC ....... 320/132, 134, 136, 150, 149, 162, 103, 320/104, 116, 157
  See application file for complete search history.

(56) References Cited

U.S. PATENT DOCUMENTS

| | | | |
|---|---|---|---|
| 6,832,171 B2 | 12/2004 | Barsoukov et al. | |
| 7,136,762 B2 * | 11/2006 | Ono | G01R 31/361 320/132 |
| 7,688,032 B2 * | 3/2010 | Kamishima | G01R 31/361 320/132 |
| 7,808,244 B2 * | 10/2010 | Barsukov | G01R 31/3624 320/132 |
| 8,049,465 B2 * | 11/2011 | Barsoukov | H01M 10/482 320/132 |
| 8,207,740 B2 * | 6/2012 | Lin | H01M 10/441 180/207.3 |
| 8,248,033 B2 * | 8/2012 | Nishi | B60L 3/0046 320/132 |
| 8,922,168 B2 * | 12/2014 | Ko | H02J 7/0021 320/132 |
| 8,954,777 B2 * | 2/2015 | Tatsumoto | G06F 1/263 320/127 |

(Continued)

Primary Examiner — Alexis A Boateng
(74) Attorney, Agent, or Firm — Schwegman Lundberg & Woessner, P.A.

(57) ABSTRACT

A device to determine a state of a battery is disclosed. One or more transistors provide a resistance between first and second nodes. The one or more transistors are configured to conduct a supply current from a battery between the first node and the second node. A measurement circuit measures the voltage generated between the first node and the second node. The measurement circuit further measures the supply voltage. A calculation circuit generates an estimate of the supply current based on the voltage measured between the first node and the second node and the resistance of the one or more transistors. The calculation circuit generates an estimate of the state of charge of the battery based on the measured supply voltage and the estimate of the supply current.

14 Claims, 4 Drawing Sheets

(56) References Cited

U.S. PATENT DOCUMENTS

| | | | |
|---|---|---|---|
| 2005/0134230 A1* | 6/2005 | Sato | H01M 10/4264 320/136 |
| 2010/0247988 A1* | 9/2010 | Okumura | B60K 6/445 429/90 |
| 2011/0234173 A1* | 9/2011 | Kao | H02J 7/0073 320/150 |
| 2012/0326726 A1* | 12/2012 | Tabuchi | G01R 31/3648 324/434 |

* cited by examiner

VOLTAGE-BASED FUEL GAUGE ON BATTERY CAPACITY

TECHNICAL FIELD

This document pertains generally, but not by way of limitation, to battery gauge circuits.

BACKGROUND

Battery gauges or monitors include electronic circuits that estimate the current power level or capacity of batteries. An estimate of the current power level or capacity can be generated based, in part, on measuring the voltage provided by a battery. For example, if the battery provides a relatively large supply voltage, then the supply voltage can indicate that the battery has a significant portion of capacity remaining. Estimates of the remaining capacity of the battery can be useful for optimizing the system efficiency or regulating the supply power. Moreover, the remaining capacity is relevant information for applications that draw power from the battery, as well as applications that charge the battery.

Overview

The systems, methods, and devices of the invention each have several aspects, no single one of which is solely responsible for its desirable attributes. Without limiting the scope of this invention as expressed by the claims which follow, some features will now be discussed briefly. After considering this discussion, and particularly after reading the section titled "Detailed Description," one will understand how the features of this invention provide advantages that include improving voltage sensing.

In one example embodiment, a device to determine a state of a battery is disclosed. The device comprises first and second nodes. The first node is configured to receive a supply current and a supply voltage from the battery. The device further comprises one or more transistors configured to provide a resistance between the first and second node. The one or more transistors are configured to conduct the supply current between the first node and the second node, thereby generating a voltage between the first node and the second node. The device further comprises a measurement circuit configured to measure the voltage generated between the first node and the second node. The measurement circuit is further configured to measure the supply voltage. The device further comprises a calculation circuit configured to generate an estimate of the supply current based at least on the voltage measured between the first node and the second node and the resistance of the one or more transistors. The calculation circuit is further configured to generate an estimate of the state of charge of the battery based at least on the measured supply voltage and the estimate of the supply current.

In another example embodiment, a method for determining a state of a battery is disclosed. The method comprises receiving, at a first node, a supply current and a supply voltage from the battery. The method further comprises conducting the supply current between the first node and a second node via one or more transistors, thereby generating a voltage between the first node and the second node. The method further comprises measuring, with a first circuit, the voltage generated between the first node and the second node. The method further comprises measuring, with the first circuit, the supply voltage. The method further comprises generating, with a second circuit, an estimate of the supply current based at least on the voltage measured between the first node and the second node and a resistance of the one or more transistors. The method further comprises generating, with the second circuit, an estimate of the state of charge of the battery based at least on the measured supply voltage and the estimate of the supply current.

In another embodiment, a device for determining a state of a battery is disclosed. The device comprises means for providing a resistance between a first node and a second node. The providing means is configured to conduct a supply current between the first node and the second node, thereby generating a voltage between the first node and the second node. The device further comprises means for measuring the voltage generated between the first node and the second node. The measuring means is configured to measure a supply voltage of the battery. The device further comprises means for generating an estimate of the supply current based at least on the voltage measured between the first node and the second node and the resistance of the providing means. The generating means is configured to generate an estimate of the state of charge of the battery based at least on the measured supply voltage and the estimate of the supply current.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Embodiments relate to systems and methods for voltage-based fuel gauging. In one embodiment, the system measures a supply voltage of a battery during operation of the battery. Operation can include discharging or charging the battery. Since the supply voltage depends on the stored charge of the battery, the measured supply voltage can be used to estimate the remaining stored charge of the battery. For example, one or more functions can be used to map the measured supply voltage to the level of the remaining stored charge. The one or more functions can be derived based on experimental data generated from various baseline conditions. One set of example baseline conditions may include no loading on the battery and room temperature.

In one embodiment, the system corrects for various sources of errors that can occur during operation. This can happen because the operation of the battery may deviate away from the baseline conditions from which the relationship was derived. One example of a deviation that affects the relationship is a load current or charge current of the battery ("load level"). In addition, another example includes changes in the internal temperature of the battery. Load level and temperature can each affect how the supply voltage of the battery is related to the level of the remaining charge of the battery. Various embodiments disclosed herein can reduce the errors caused by these effects by adjusting the measured supply voltage with estimates of the off-baseline conditions.

In one specific example, the system estimates the load current of the battery in order to compensate for load level effects. For example, the system can include an internal transistor used to sense the level of the supply current that the battery is discharging or receiving. The internal transistor, being positioned between the battery and the system to be powered, can be used to sense the level of the supply current by conducting the supply current and then by measuring the voltage drop across the transistor generated by conducting the supply current. By knowing the resistance provided by the transistor, the supply current can be estimated algebraically from the measured voltage of the internal transistor. In turn, the estimated level of the load current can be used to adjust the supply voltage measurement, and the adjusted supply voltage measurement can be mapped to the remaining charge of the battery. In some embodiments, the resistance of the internal transistor can be varied in order to trade off improved measurement resolution and reduced power consumption.

In another specific example, the system estimates the battery temperature in order to compensate for temperature effects. For example, the system can include a circuit used to measure a voltage that is indicative of temperature of the battery. The estimated temperature can be used to adjust the measurement of the supply voltage, and the adjusted supply voltage can be mapped the remaining charge of the battery.

Figure 1:
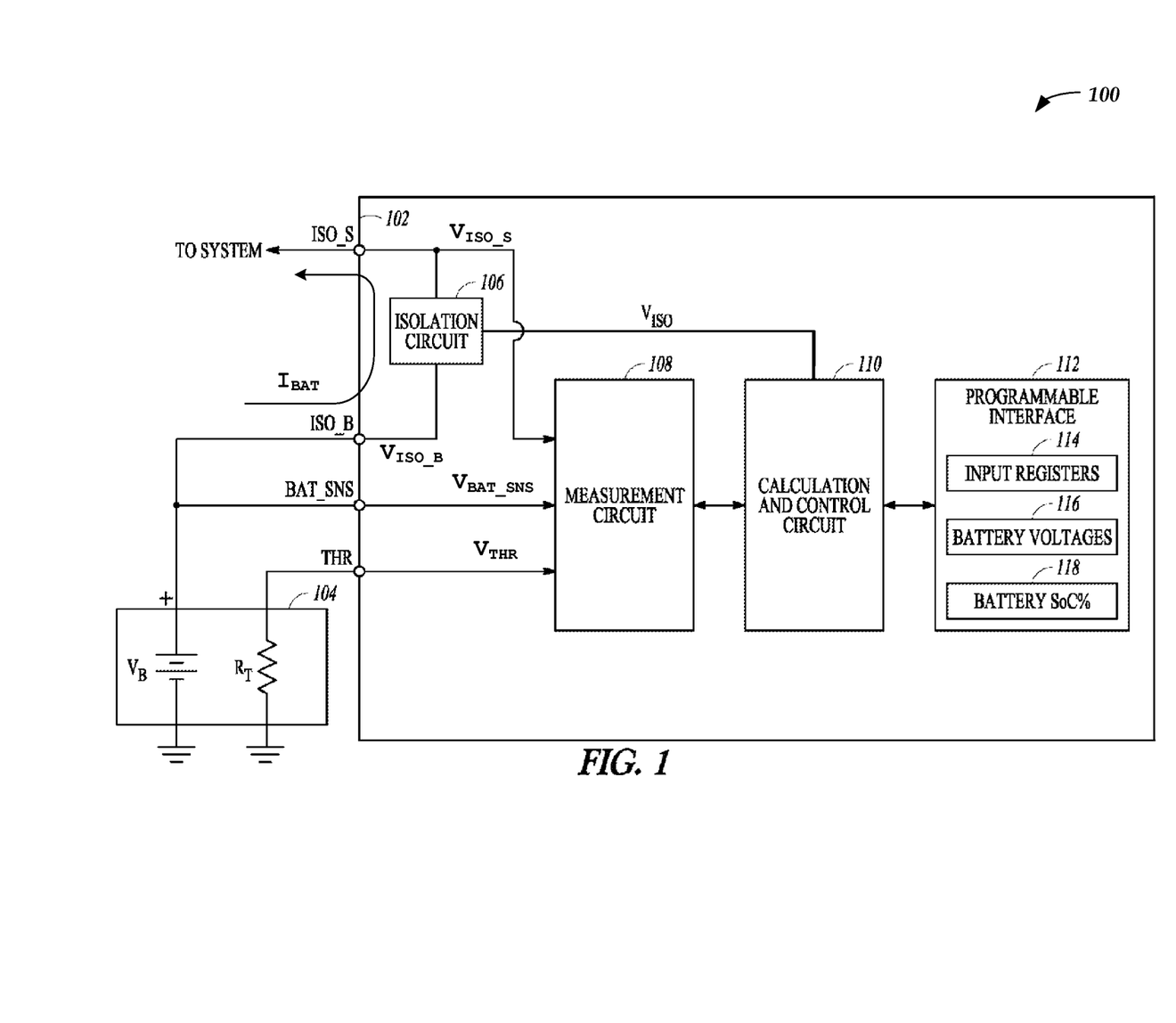
FIG. 1 is a schematic block diagram illustrating a power system including a battery gauge and a battery in accordance with various embodiments described herein.

To further illustrate, FIG. 1 is a schematic block diagram illustrating a power system 100 including a battery gauge 102 and a battery 104 in accordance with various embodiments described herein. The battery gauge 102 can include an isolation circuit 106, a measurement circuit 108, a calculation and control circuit ("calculation circuit") 110, and a programmable interface 112. The programmable interface 112 can include one or more input registers 114, one or more battery-voltage registers 116, and one or more state of charge registers 118. The battery 104 can include a voltage source $V_B$ and an internal resistive element $R_T$.

In the illustrated embodiment, the battery gauge 102 is operatively coupled to the battery 104 at nodes ISO_B, BAT_SNS, and THR. The node ISO_B can receive a supply voltage (e.g., manifesting as the voltage $V_{ISO\_B}$) and supply current $I_{BAT}$ from the battery 104 if the battery 104 is discharging. Additionally or alternatively, the node ISO_B can provide a charging voltage and a charging current to the battery 104 if the battery 104 is recharging. The node BAT_SNS can receive a supply voltage (e.g., manifesting as the voltage $V_{BAT\_SNS}$) from the battery 104 for voltage sensing. In some embodiments, the node BAT_SNS does not draw a substantial current. The node THR can receive temperature-related measurements (e.g., manifesting as the voltage $V_{THR}$) from the battery. In one embodiment, the node THR receives negative temperature coefficient (NTC) information from a battery's thermistor or temperature sensor.

The isolation circuit 106 of the battery gauge 102 is operatively coupled between nodes ISO_S and ISO_B of the battery gauge 102. The node ISO_S can provide a supply voltage (e.g., manifesting as the voltage $V_{ISO\_S}$) and a supply current $I_{BAT}$ from the battery 104 if the battery 104 is discharging. Additionally or alternatively, the node ISO_S can receive a charging voltage and a charging current to the battery 104 if the battery 104 is recharging. The isolation circuit 106 can serve a current sensing circuit disposed between the battery 104 and an external system (not shown).

The measurement circuit 108 of the battery gauge 102 is operatively coupled to the nodes ISO_S, BAT_SNS, and THR of the battery gauge 102. In some embodiments, the measurement circuit 108 can be coupled to the node ISO_B in addition to, or in alternative to, node BAT_SNS. The calculation circuit 110 of the battery gauge 102 is operatively coupled to the isolation circuit 106 and to the measurement circuit 108. The programmable interface 112 of the battery gauge 102 is operatively coupled to the calculation circuit 110.

In operation, the battery gauge 102 can be configured to generate an estimate of the state of charge of the battery 104. The term state of charge as used herein can include the amount of charge remaining in the battery and can be expressed as a percentage. For example, a state of charge of 60% indicates that the battery is storing 60% of its capacity.

The node BAT_SNS can be configured to receive at least a portion of the supply voltage $V_B$ from the battery 104, which can generate a measurement $V_{BAT\_SNS}$. The measurement $V_{BAT\_SNS}$ can be at least partially indicative of the state of charge of the battery 104. Accordingly, the battery gauge 102 can be configured to utilize the measurement $V_{BAT\_SNS}$ for generating an estimate of the state of charge, as will be described below in greater detail in connection with FIGS. 4-6.

Additionally or alternatively, the battery gauge 102 can be configured to conduct a supply current $I_{BAT}$ to and/or from the battery 104. For example, if the battery 104 is to supply power to an external system, the supply current $I_{BAT}$ is carried from the node ISO_B to the node ISO_S. Moreover, if the battery 104 is to receive power, the supply current $I_{BAT}$ is carried from the node ISO_S to the node ISO_B.

When the battery gauge 102 conducts the supply current $I_{BAT}$ across the nodes ISO_S and ISO_B, the battery gauge 102 can be configured to generate a voltage $V_{ISO\_SB}$ across the nodes IOS_S and ISO_B due to a resistance between those nodes. Accordingly, the battery gauge 102 can be configured to generate an estimate of the supply current $I_{BAT}$ based on the voltage $V_{ISO\_SB}$ and the resistance provided between the nodes ISO_S and ISO_B, as will be described below in greater detail in connection with FIGS. 2A, 2B, and 5.

In one aspect described herein, estimating the supply current $I_{BAT}$ can be used to improve the estimate of the state of charge of the battery 104. Variations in the supply current $I_{BAT}$ can affect the relationship between the measurement $V_{BAT\_SNS}$ and the state of charge of the battery 104. In one embodiment the relationship between the measurement $V_{BAT\_SNS}$ and the state of charge of the battery 104 can be predetermined based on a baseline value of the load level (e.g., one baseline can correspond to an open circuit voltage of the battery 104). If the battery 104, for example, supplies power to the external system, the actual relationship between the measurement $V_{BAT\_SNS}$ and the state of charge may vary from the predetermined relationship that was derived from the baseline conditions. Accordingly, to improve the accuracy of the estimate of the state of charge during operation, the battery gauge 102 can generate an estimate of the supply current $I_{BAT}$ to compensate for the load level on the battery 104 during operation.

Additionally or alternatively, the battery gauge 102 can be configured to measure or sense a characteristic of the battery 104 that is indicative of internal temperature of the battery 104. For example, the illustrated battery gauge 102 is operatively coupled to the resistive element $R_T$ of the battery 104 at the node THR for receiving a voltage $V_{THR}$. The resistive element $R_T$ can have a resistance that changes with the internal temperature of the battery 104. For example, the resistance of the resistive element $R_T$ can increase as the temperature of the battery 104 decreases. Moreover, the resistance of the resistive element $R_T$ can decrease as the temperature of the battery 104 increases. Accordingly, the battery gauge 102 can estimate the temperature of the battery 104 based on the voltage $V_{THR}$ and the current $I_{THR}$, as will be discussed in greater detail in connection with FIGS. 3-5.

In one aspect described herein, estimating the temperature of the battery 104 can be used to improve the estimate of the state of charge of the battery 104. For example, variations in the battery temperature can affect the relationship between the measurement $V_{BAT\_SNS}$ and the state of charge of the battery 104. For the purpose of illustration, in one embodiment the relationship between the measurement $V_{BAT\_SNS}$ and the state of charge of the battery 104 can be predetermined based on a baseline value of the temperature of the battery 104. Accordingly, if during operation, the temperature of the battery 104 varies, the relationship between the measurement $V_{BAT\_SNS}$ and the state of charge may vary as a result. Accordingly, to improve the accuracy of the estimate of the state of charge during operation, the battery gauge 102 can use an estimate of the temperature of the battery 104 to compensate for temperature variations and/or off baseline conditions during operation.

The isolation circuit 106 of the battery gauge 102 can be configured to conduct the supply current $I_{BAT}$ between the battery 104 and the external system. In one embodiment the isolation circuit 106 can include one or more transistors coupled between the nodes ISO_S and ISO_B. Accordingly, the isolation circuit 106 can provide a resistance (e.g., the "on resistance" between the sources and the drains of the transistors) between the nodes ISO_S and ISO_B. If the isolation circuit 106 conducts the supply current $I_{BAT}$ between the nodes ISO_S and ISO_B, a voltage $V_{ISO\_SB}$ can be generated between the nodes ISO_S and ISO_B.

In one embodiment, the isolation circuit 106 can be configured to provide a selectable resistance between the nodes ISO_S and ISO_B. The selection of the resistance of the isolation circuit 106 can be selected dynamically during operation, for example, based on the magnitude of the supply current $I_{BAT}$ or the voltage $V_{ISO\_SB}$. For instance, the isolation circuit 106 can adjust the resistance between the nodes ISO_S and ISO_B based on comparing one or more of the magnitude of the supply current $I_{BAT}$ or the voltage $V_{ISO\_SB}$ to corresponding predetermined thresholds. In another embodiment, the selection of the resistance of the isolation circuit 106 is determined offline based on a setting (e.g., data received by the programmable interface 112) of the battery gauge 102. As such, the resistance of the isolation circuit 106 can be determined during an initialization process by retrieving data from the programmable interface 112 and then setting the resistance in accordance with the data. In one embodiment, the threshold is based on the battery 104.

In one example aspect of some embodiments described herein, providing a selectable resistance between the nodes ISO_S and ISO_B can improve the quality of the measurements $V_{ISO\_SB}$, for example, if $V_{ISO\_SB}$ is relatively small (e.g., smaller than a threshold). For example, relatively small values of the voltage $V_{ISO\_SB}$ can occur if the magnitude of the supply current $I_{BAT}$ becomes relatively small (e.g., due to the state of charge, loading, and the like conditions of the battery 104). Small values of the voltage $V_{ISO\_SB}$ can be difficult to measure effectively due to issues of measurement precision, sensor resolution, signal-to-noise ratio, and the like measurement issues. Accordingly, some embodiments of the isolation circuit 106 can be configured to the select the resistance of the isolation circuit 106 in a way that generates the voltage $V_{ISO\_SB}$ at a level that can be effectively measured.

In another example aspect of some embodiments described herein, providing a selectable resistance between the nodes ISO_S and ISO_B can reduce power consumption of the battery gauge 102, for example, if $V_{ISO\_SB}$ is relatively large. Relatively large values of the voltage $V_{ISO\_SB}$ can occur if the magnitude of the supply current $I_{BAT}$ becomes relatively large (e.g., because of the state of charge, loading, and the like conditions of the battery 104). Large values of the voltage $V_{ISO\_SB}$ can consume substantially more power than necessary. Accordingly, some embodiments of the isolation circuit 106 can be configured to select the resistance provided by the isolation circuit 106 in a way that generates the voltage $V_{ISO\_SB}$ to reduce power consumption. For example, the isolation circuit 106 can be configured to reduce the resistance of the isolation circuit 106 if at least one of the supply current $I_{BAT}$ or the voltage $V_{ISO\_SB}$ is greater than some predetermined threshold.

The isolation circuit 106 will be described in greater detail later in connection with FIGS. 2A and 2B.

The measurement circuit 108 of the battery gauge 102 can be configured to measure the voltage generated between the nodes ISO_S and ISO_B. For example, the measurement circuit 108 can have a first end operatively coupled to the node ISO_S for sensing $V_{ISO\_S}$ and a second end operatively coupled to the node ISO_B for sensing the voltage $V_{ISO\_B}$. In one embodiment, the measurement circuit 108 can be configured to sense the voltage $V_{ISO\_SB}$ for a fixed duration periodically.

In one embodiment, the measurement circuit 108 can be configured to measure the supply voltage $V_{BAT\_SNS}$. For example, the measurement circuit 108 can have a first end operatively coupled to the node BAT_SNS (or ISO_B) for sensing $V_{BAT\_SNS}$ and a second end operatively coupled to a reference node, such as ground. In one embodiment, the measurement circuit 108 can be configured to sense the voltage $V_{BAT\_SNS}$ for a fixed duration periodically. Additionally, the measurement circuit 108 can be configured to sense the voltages $V_{ISO\_SB}$ and $V_{BAT\_SNS}$ simultaneously or at separate times.

In another embodiment, the measurement circuit 108 can be configured to measure the voltage $V_{THR}$ of the battery 104. As stated, the voltage $V_{THR}$ is indicative of a temperature characteristic of the battery 104. In one embodiment, the measurement circuit 108 is configured to sense the voltage $V_{THR}$ for a fixed duration periodically. Additionally, the measurement circuit 108 can be configured to sense the voltages $V_{ISO\_SB}$, $V_{BAT\_SNS}$, $V_{THR}$ simultaneously or at separate times.

The measurement circuit 108 will be described in further detail later in connection with FIG. 3.

The calculation circuit 110 of the battery gauge 102 can be configured to receive one or more measurements of $V_{ISO\_SB}$, $V_{BAT\_SNS}$, or $V_{THR}$ as inputs and to generate an estimate of the state of charge of the battery 104 as an output. For example, the calculation circuit 110 can generate the state of charge based on receiving, from the measurement circuit 108, of one or more measurements of $V_{ISO\_SB}$, $V_{BAT\_SNS}$, or $V_{THR}$. The state of charge can be generated based on a relationship between the state of charge and the measurements $V_{ISO\_SB}$, $V_{BAT\_SNS}$, or $V_{THR}$. The calculation circuit can correspond to an application specific integrated circuit (ASIC), a controller, a programmable logic device (PLD), logic circuit, and/or a combination of such analog or digital electronics In one embodiment, the relationship can be approximated by one or more linear functions (e.g., in accordance to a piecewise linear function). For example, the state of charge can be based on one or more linear functions that relate a supply voltage to the state of charge of the battery 104 at a baseline load level (e.g., an open circuit voltage $V_{OCS}$) and at a baseline temperature (e.g., room temperature). For example, the voltage $V_{BAT\_SNS}$ can be used as an approximation to the open circuit baseline voltage. In alternative embodiments, one or more second-order or higher polynomials or other types of non-linear functions may be used instead of linear functions to approximate the relationship of the supply voltage to the state of charge of the battery 104 at the baseline load level and at the baseline temperature.

In one embodiment, the calculation circuit 110 can be configured to retrieve data from the programmable interface 112 that determine the relationship between the supply voltage of the battery 104 to its state of charge. For example, the calculation circuit may retrieve a plurality of predetermined supply voltages corresponding to certain state of charge values. In one embodiment, the calculation circuit 112 retrieves from the a data register of the programmable interface 112 three values $V_{BAT10}$, $V_{BAT60}$, and $V_{BAT90}$ that correspond to the open circuit values $V_{OSC}$ that are associated with 10% state of charge, 60% state of charge, and 90% state of charge, respectively. One skilled in the art would appreciate that more or less values can be used. For example, in one embodiment, at least a 10-point table of battery voltage vs. state of charge is stored in the input registers 114. The measured or sensed battery $V_{BAT\_SNS}$ (or compensated open circuit voltage $V_{OCS}$ as described below) can be compared to the retrieved data to calculate or estimate the current state of charge, for example by linear interpolation or using linear functions. For example, the calculation circuit 110 can include combinatorial logic to calculate the state of charge based on the measured or sensed supply voltage $V_{BAT\_SNS}$ and the retrieved data from the programmable interface 112.

During operation, the voltage $V_{BAT\_SNS}$ may not correspond to the baseline voltage, for example, due to an off-baseline loading on the battery 104, such as loading on the battery 104 or changes in the battery temperature. Accordingly, the calculation circuit 110 can "adjust" or "compensate" $V_{BAT\_SNS}$ to estimate the baseline voltage (e.g., by translating the voltage $V_{BAT\_SNS}$ to the open circuit voltage $V_{OCS}$) by estimating the load current based on the voltage $V_{ISO\_SB}$ and the resistance of the isolation circuit 106. One example method for adjusting the battery supply measurement $V_{BAT\_SNS}$ based on the load current is described is described in greater detail later in connection with FIG. 5 and, in particular, Equation 4.

Additionally or alternatively, during operation, the temperature of the battery 104 may not correspond to the baseline temperature, for example, due to the effects of discharging or charging the battery 104. In one embodiment, the measurement circuit 108 can be configured to measure the voltage VTHR and translate that voltage reading to a battery temperature coefficient $T_{CBAT}$. For example, the battery temperature coefficient $T_{CBAT}$ can be determined from the voltage $V_{THR}$ based on NTC data stored in the input registers 118 of the programmable interface 112. The NTC data can include a table of battery temperature coefficient $T_{CBAT}$ vs. voltage $V_{THR}$. Accordingly, the calculation circuit 110 can "adjust" $V_{BAT\_SNS}$ for use as the baseline voltage by estimating the temperature of the battery 104 based on the voltage $V_{THR}$. One example method for adjusting the battery supply measurement $V_{BAT\_SNS}$ based on the temperature is described is described in greater detail later in connection with FIG. 5 and, in particular, Equation 4.

In some embodiments the calculation circuit 110 can be configured to control the isolation circuit 106. For example, based at least on one of the load current $I_B$ or the voltage $V_{ISO\_SB}$, the calculation circuit 110 can generate a control signal $V_{ISO}$ to select the resistance of the isolation circuit 106, for instance, to improve the measurements of $V_{ISO\_SB}$ and/or to reduce power consumption of the isolation circuit 106. In another embodiment, the calculation circuit 110 can retrieve data from the programmable interface 112. The data can be indicative of various operation parameters, including a selected resistance of the isolation circuit 106. Additionally or alternatively, the operation parameters can include minimum and/or maximum thresholds of at least one of the load current $I_{BAT}$ or voltage $V_{ISO\_SB}$. The thresholds can be used to determine the selection of the isolation circuit 106. For example, if the load current $I_{BAT}$ or voltage $V_{ISO\_SB}$ is below a minimum threshold, the calculation circuit 110 can be configured to increase the resistance of the isolation circuit 106. As another example, if the load current or voltage $V_{ISO\_SB}$ is above a maximum threshold, the calculation circuit 110 can be configured to decrease the resistance of the isolation circuit 106.

The programmable interface 112 of the battery gauge 102 can be configured to receive the estimate of the state of charge as an inputs and to provide the estimate of the state of charge as an output. For example, the programmable interface 112 can receive the estimate of the state of charge from the calculation circuit 110 and store the estimate in the state of charge registers 118. Examples of the state of charge registers 118 include data registers and any other applicable data storage circuits or devices. The programmable interface 112, in some embodiments, can provide an interface for external devices to access the estimate of the state of charge. For example, an external controller (not shown) can access the estimate of the state of charge register 118 to determine a loading level on the battery 104 or to control a charging process on the battery 104. In one embodiment, the programmable interface 112 can correspond to any suitable interface including registers and a multimaster serial single-ended computer bus, such as an Inter-Integrated Circuit ($I^2C$) interface.

In addition, some embodiments of the programmable interface 112 can be configured to store the measurements of various voltages (e.g., $V_{BAT\_SNS}$, $V_{ISO\_SB}$, and/or $V_{THR}$). For example, the programmable interface 112 can be configured to receive measurements from the calculation circuit 110 and to store those measurements in the battery voltages register 116. Storing the measurements can aid in the process of estimate the state of charge. For example the measurement circuit 108 can be configured to perform measurements sequentially. In this case, the measurements can be stored in the battery voltages register 116 until they are used to generate the estimate of the state of charge. Additionally, the programmable interface 112 can provide the measurements to an external device to perform various ancillary and/or independent functions.

In addition, some embodiments of the programmable interface 112 can be configured to store various inputs to the battery gauge 102. As stated, one example input includes data used to determine the resistance of the isolation circuit 106. It will be appreciated that any suitable input can be stored in the input registers 114, such data related to battery characteristics, for example, but not limited to, the internal resistance of the batters, voltages used to determine the relationship between the battery supply voltage and the state of charge (for example, the values of the voltages $V_{BAT10}$, $V_{BAT60}$, and $V_{BAT90}$), battery chemistry information, and NTC data.

In some embodiments, the isolation circuit 106, the measurement circuit 108, and the calculation circuit 110 can form at least part of a monolithic integrated circuit. For example, the one or more transistors of the isolation circuit 106 can be arranged internally to the battery gauge 102. The nodes ISO_S, ISO_B, BAT_SNS, and THR each can correspond to a physical pin, a pad, a port, a lead, a terminal, a contact, a connector, or a like node of the integrated circuit of the fuel gauge 102. In one embodiment, the integrated circuit of the battery gauge 102 can be configured to charge the battery 104 by conducting a charging current from the second node to the first node via the one or more transistors.

The one or more transistors of the isolation circuit 106 being internal—opposed to external resistors/transistors—can reduce power consumption of the battery gauge 102. Additionally, integrating the one or more transistors of the isolation circuit 106 and to the integrated circuit of the fuel gauge 102 allows the fuel gauge 102 to effectively and/or efficiently adjust the resistance of the isolation circuit 106.

Figure 2A:
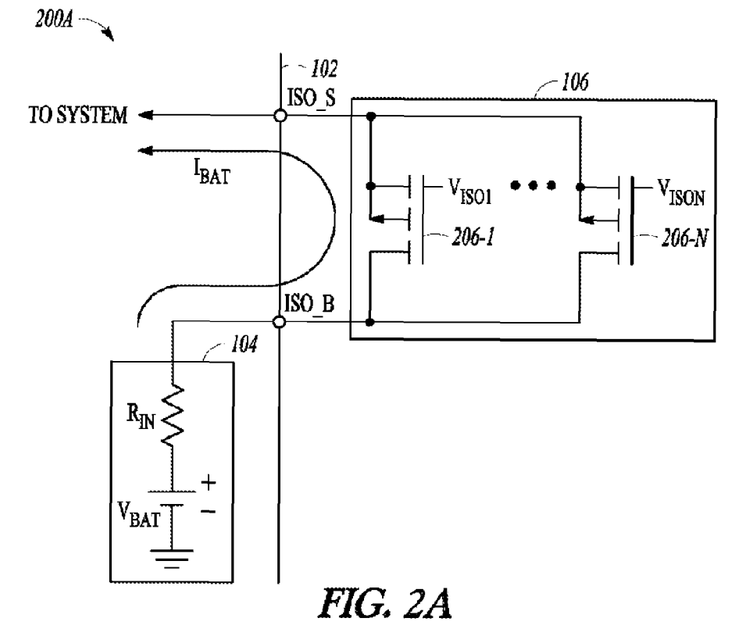
FIG. 2A is a schematic diagram illustrating one example embodiment of an isolation circuit of the battery gauge of FIG. 1.

FIG. 2A is a schematic diagram illustrating one example embodiment of an isolation circuit subsystem 200A of the power system 100 of FIG. 1. The isolation circuit subsystem 200A includes the isolation circuit 106 of the fuel gauge 102 operatively coupled to the nodes ISO_S and ISO_B. The battery 104 includes a power supply approximately modeled by a voltage source $V_{BAT}$ and an internal resistor $R_{IN}$. The illustrated voltage source $V_{BAT}$ and the internal resistor $R_{IN}$ represent an approximate model of the behavior of the battery 104. As such, these components do not necessarily exist or do not necessarily correspond to actual lumped physical elements. The isolation circuit can include one or more transistors, such as field effect transistors (FETs) 206-1, . . . , 206-N.

As stated previously above in connection with FIG. 1, the battery 104 can be configured to provide a supply voltage $V_{ISO\_B}$ and a supply current $I_{BAT}$ as outputs. Because the battery 104 includes an internal resistance represented by $R_{IN}$, the supply voltage $V_{ISO\_B}$ can be different (for example, less than) the voltage source $V_{BAT}$. As will be described in greater detail below, this loading level effect can detrimentally affect the estimation of the state of charge of the battery 104 if it is not compensated for.

The battery gauge 102 can be configured to receive the supply voltage $V_{ISO\_B}$ and the supply current $I_{BAT}$ is inputs at the node ISO_B. In addition, the isolation circuit 106 can be configured to receive the supply current $I_{BAT}$ as an input and to provide the supply current $I_{BAT}$ at the node ISO_S as an output.

The FETs 206-1, . . . , 206-N can be arranged in parallel across the nodes ISO_S and ISO_B. For example, each of the FETs 206-1, . . . , 206-N can correspond to an N-channel MOSFET (e.g., an enhancement mode MOSFET) having a source operatively coupled to the node ISO_S and a drain operatively coupled to ISO_B. In addition each of the FETs 206-1, . . . , 206-N includes a gate to receive a control (e.g., $V_{ISO1}$-$V_{ISON}$). For example, the control signals $V_{ISO1}$-$V_{ISON}$ can be provided by the calculation circuit 110 of FIG. 1. In one embodiment, two or more of the control signals $V_{ISO1}$-$V_{ISON}$ can be set independently to control the number of transistors that are in an ON state and capable of conducting substantial current. The ON state can correspond to the linear region of operation and/or the saturation region of operation. Accordingly, the control signals $V_{ISO1}$-$V_{ISON}$ can determine the number of FETs 206-1, . . . , 206-N that are activated and/or can change the resistance that an individual FET provides while operating in the linear region of operation.

The FETs 206-1, . . . , 206-N can correspond to insulated gate field-effect transistors, such as MOSFETs. However, it will be understood that a gate can be made from materials other than metals, such as polysilicon, and an insulation layer can be made out of materials other than silicon oxide, such as a high k dielectric. It will also be understood that transistors 206-1, . . . , 206-N can have various structural types other than MOSFETs, including, but not limited to, BJT, JFET, IGFET, MESFET, pHEMT, HBT, and the like transistor structural types. Further, the transistors 206-1, . . . , 206-N can also have various polarities, such as N-type, P-type, NPN-type, and PNP-type; and can include various semiconductor materials, such as GaAs, SiGe, and the like.

Figure 2B:
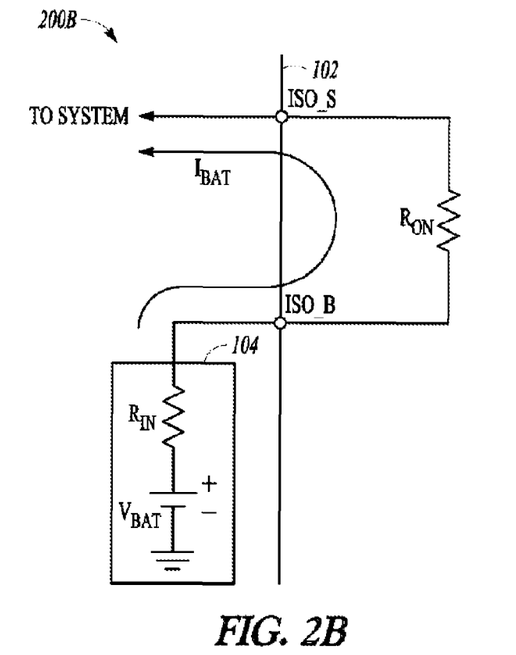
FIG. 2B is a schematic diagram illustrating a circuit approximately modeling an operation of one example embodiment of an isolation circuit of the battery gauge of FIG. 1.

Turning momentarily to FIG. 2B, a schematic diagram is shown illustrating a circuit 200B that approximately models an operation of an example embodiment of an isolation circuit 106 of the battery gauge 102 of FIG. 1. Elements common to the schematics of FIGS. 2A and 2B share common reference indicia, and only differences between the schematics are described herein for the sake of brevity.

The fuel gauge 102 includes an equivalent on-resistor $R_{ON}$ that serves to approximately model an example equivalent resistance provided by the isolation circuit 106 of FIG. 2A. The on-resistor $R_{ON}$ has a first end operatively coupled to the node ISO_B to receive the supply current $I_{BAT}$ as an input, and has a second end operatively coupled to the node ISO_S to provide the supply current $I_{BAT}$ as an output. In other words, the on-resistor $R_{ON}$ can be configured to carry the supply current $I_{BAT}$ between the nodes ISO_S and ISO_B.

The resistance of the on-resistor $R_{ON}$ can be determined based on the states of the one or more transistors of the isolation circuit 106 of FIG. 2A. For example, the resistance of the on-resistor $R_{ON}$ can decrease as the number of transistors coupled between the nodes ISO_S and ISO_B is activated. For another example, the resistance of the on-resistor $R_{ON}$ can be modulated based on the control signals $V_{ISO1}$-$V_{ISON}$ of FIG. 2A biasing one or more transistors (e.g., FETs 206-1, . . . , 206-N) operating in the linear region of operation. As yet another example, the resistance of the on-resistor $R_{ON}$ can be varied by switching in and out transistors having different sizes (for example, different channel widths). Accordingly, the resistance of the on-resistor $R_{ON}$ can be adjusted to increase or decrease the voltage between ISO_S and ISO_B generated by the supply current $I_{BAT}$.

Returning to FIG. 2A, the resistance (corresponding to the on-resistance $R_{ON}$ of FIG. 2B) of the isolation circuit 106 can be adjusted in any appropriate way. For example, as stated, the number of activated transistors can be selected to change the overall resistance of the isolation circuit 106. In another embodiment, the bias or the operating point of one or more transistors can be changed in order to change to overall resistance of the isolation circuit 106. For example, one or more of the FETs 206-1, . . . , 206-N can operate in the "linear region," "triode region," or "ohmic mode" by selection of the gate voltages $V_{ISO1}$, . . . , $V_{ISON}$, and the individual resistance of these FETs can be adjusted by adjusting the respective gate voltages $V_{ISO1}$-$V_{ISON}$. In another embodiment, the plurality of FETs 206-1, . . . , 206-N can each provide a different on-resistance value based on the sizing of the FETs 206-1, . . . , 206-N, and the resistance of the isolation circuit 106 can be changed by activating the FET with size that yields the desired resistance and deactivating the remaining FETs. However, any other suitable method can be selected, such as varying the "effective" gate width or channel width of the transistors by field effects or by activating/deactivating physical channels on the integrated circuit. Moreover, the resistance of the isolation circuit 106 can be selected during initialization and fixed during operation, or varied dynamically based on the level of at least one of the supply current $I_{BAT}$ or the voltage $V_{ISO\_SB}$, as was discussed earlier in connection with FIG. 1. It will be appreciated that the one or more transistors can be arranged in other applicable configuration suitable to determine current flow and need not be arranged in the parallel configuration shown in FIG. 2A.

Figure 3:
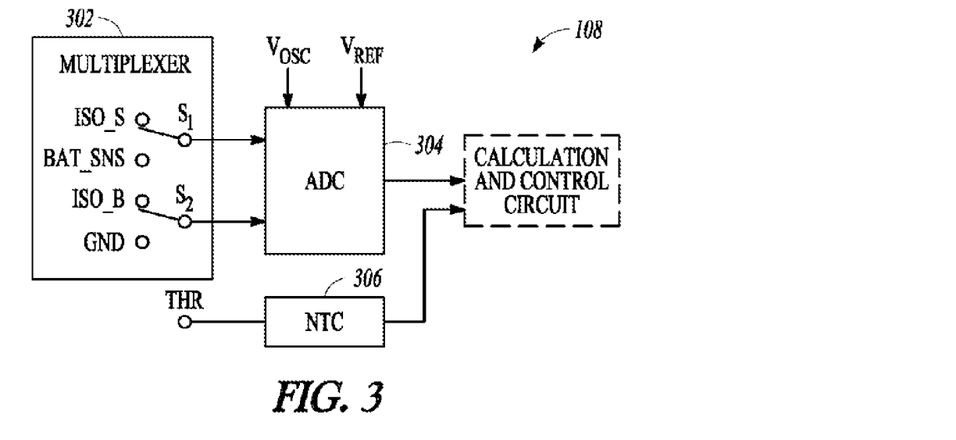
FIG. 3 is a schematic diagram of an example embodiment of a measurement circuit of the battery gauge of FIG. 1.

FIG. 3 is a schematic diagram of an example embodiment of a measurement circuit 108 of the battery gauge 102 of FIG. 1. The illustrated measurement circuit 108 includes a multiplexer 302, analog-to-digital converter (ADC) 304, and a negative temperature coefficient (NTC) block 306. In some embodiments, the NTC block 306 can include voltage sensing circuitry, such as an ADC and digital logic circuitry.

The multiplexer 302 includes a first switch S1 that is configured to switch between the nodes ISO_S and BAT_SNS in order to selectively provide the voltage $V_{ISO\_S}$ or the voltage $V_{BAT\_SNS}$ as a first output. The multiplexer 302 further includes a second switch S2 that is configured to switch between the nodes ISO_B and GND to selectively provide $V_{ISO\_B}$ and $V_{GND}$ as a second output.

The ADC 304 can be configured to receive the first and second outputs of the multiplexer 302, an oscillator voltage $V_{OSC}$, and a reference voltage $V_{REF}$ as inputs and to provide various digital measurements as outputs. For example, the ADC 304 can be configured to measure the voltage $V_{ISO\_SB}$ by taking the difference between the first and second outputs of the multiplexer 302 if the first switch S1 is set to couple with the node ISO_S and the second switch S2 is set to couple with the node ISO_B. In addition, the ADC 304 can be configured to measure $V_{BAT\_SNS}$ by taking the difference between the first and second outputs of the multiplexer 302 if the first switch S1 is set to couple with the node BAT_SNS and the second switch S2 is set to couple with the node GND. The oscillator voltage $V_{OSC}$ can serve to provide a timing signal, such as a clock signal. The reference voltage $V_{REF}$ can serve to provide quantization parameters, such as quantization levels, and to bias the ADC. In one specific embodiment, the ADC corresponds to a 12-bit ADC circuit. However, ADCs having any suitable bit numbers can be used in view of cost, complexity, power consumptions, and other application specific considerations.

The NTC block 306 is configured to receive a voltage $V_{THR}$ as an input and configured to provide a battery temperature coefficient $T_{CBAT}$ as an output. In one embodiment, the battery 104 can include a thermistor, which is a resistor with negative temperature coefficient, for providing the voltage $V_{THR}$. However, alternative embodiments can be provided temperature information from other external sources. For example, a microcontroller can read temperature information from an external temperature sensing circuit and can write the result to NTC block 306 via an interface such as an I²C bus.

Accordingly, the NTC block 306 can generate the battery temperature coefficient $T_{CBAT}$ based on receiving the voltage $V_{THR}$ from the node THR. As stated, the voltage $V_{THR}$ is indicative of internal temperature of the battery 104. Moreover, the battery temperature coefficient $T_{CBAT}$ is based on the temperature of the battery 104. Accordingly, the NTC block 306 implements the mapping of the voltage $V_{THR}$ to the battery temperature coefficient $T_{CBAT}$. As stated, in some embodiments, the NTC block 306 can access the programmable interface 112 to retrieve stored data related to mapping the sensed voltage $V_{THR}$ to the battery temperature coefficient $T_{CBAT}$. In one example embodiment, the programmable interface 112 stores data related to pre-categorizing the voltage $V_{THR}$ to the battery temperature coefficient $T_{CBAT}$. In another embodiment, the data can include a plurality of $V_{THR}$, $T_{CBAT}$ pairs used for interpolating the measured $V_{THR}$ to the battery temperature coefficient $T_{CBAT}$. The mapping can be implemented by using any suitable method, such as analog or digital circuitry or general-purpose processor executing instructions (e.g., implementing a table lookup, interpolation, or the like mapping methods).

Figure 4:
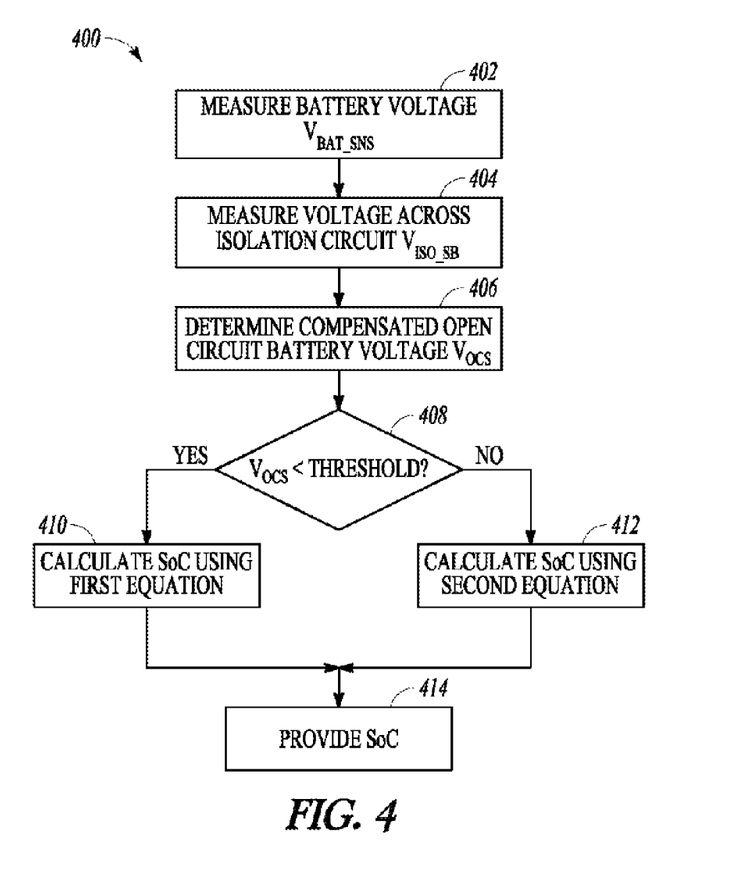
FIG. 4 is process flow diagram of an example embodiment of a method for calculating a state of charge of the battery of the power system of FIG. 1.

FIG. 4 is process flow diagram of an example embodiment of a method 400 for calculating a state of charge of a battery of the power system 100 of FIG. 1. The method 400 can include a block 402 for measuring the battery voltage $V_{BAT\_SNS}$. The measurement of the battery voltage $V_{BAT\_SNS}$ can correspond to an analog or digital signal. For instance, the battery voltage $V_{BAT\_SNS}$ can be measured or sensed at the node BAT_SNS of a fuel gauge by using a measurement circuit, such as shown in the example of FIG. 1. In one embodiment, an ADC can be used to measure $V_{BAT\_SNS}$ by digitally sampling and taking the difference in voltages between the nodes BAT_SNS and GND, such as shown in the example of FIG. 3.

The method 400 can include a block 404 for measuring the voltage $V_{ISO\_SB}$ across an isolation circuit. The isolation circuit can include one or more transistors conducting a supply current $I_{BAT}$ from the battery to an external system. The one or more transistors can provide resistance that causes a voltage to be generated as the one or more transistors conduct the supply current $I_{BAT}$. The measurement of the voltage $V_{ISO\_SB}$ across the isolation circuit can correspond to an analog or digital signal. For instance, the voltage $V_{ISO\_SB}$ can be measured or sensed by measuring the voltages at the nodes ISO_S and $_{ISO\_B}$ by using a measurement circuit, such as shown in the example of FIG. 1. In one embodiment, an ADC can be used to measure $V_{ISO\_SB}$ by digitally sampling and taking the difference in voltages between the nodes ISO_S and ISO_B, such as shown in the example of FIG. 3.

The method 400 can include block 406 for determining a compensated open circuit battery voltage $V_{OCS}$. For example, the compensated open circuit battery voltage $V_{OCS}$ can be determined by adjusting the battery voltage $V_{BAT\_SNS}$ based on the measured voltage $V_{ISO\_SB}$ of block 402. In addition, the compensated open circuit battery voltage $V_{OCS}$ can be determined by also adjusting the battery voltage $V_{BAT\_SNS}$ based on the temperature of the battery. As stated, the measured battery voltage $V_{BAT\_SNS}$ can be adjusted to compensated for variations in battery loading levels and temperature and to translate the measured battery voltage $V_{BAT\_SNS}$ to the "baseline" open circuit battery voltage. As stated, the state of charge can be determined based on a relationship (such as one or more equations) between, for example, the baseline open circuit battery voltage. Accordingly, the measured battery voltage $V_{BAT\_SNS}$ should be adjusted to the baseline during operation in order to use the relationship effectively. In one embodiment, a calculation circuit can be used to determine the compensated open circuit battery voltage $V_{OCS}$, such as shown in the example of FIG. 1. Block 406 will be described in greater detail later in connection with FIG. 5.

Figure 6:
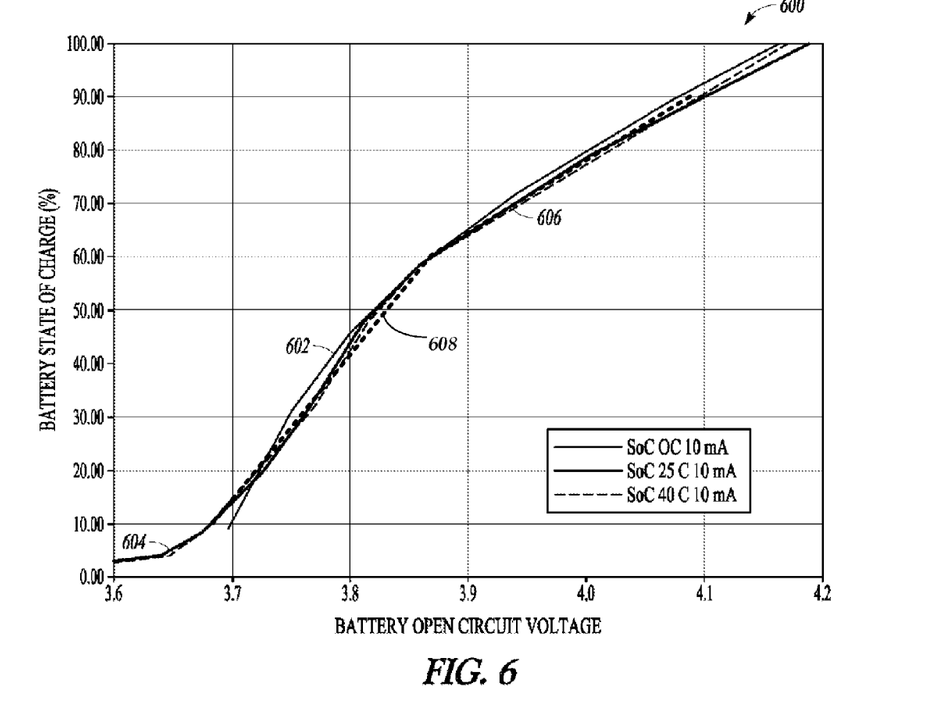
FIG. 6 is plot of example embodiments of linear functions of state of charge versus battery open circuit voltage.

The method 400 can include block 408 for comparing the compensated open circuit battery voltage $V_{OCS}$ to a threshold or a range. This test can be performed to account for the changes in the relationship between the compensated open circuit voltage $V_{OCS}$ and the state of charge of the battery. In particular, it has been observed that the relationship changes as the state of charge changes. In particular, the sensitivity of the relationship of the state of charge to the compensated open circuit voltage $V_{OCS}$ varies with the state of charge. As a result, modeling the relationship between the state of charge and the open circuit voltage $V_{OCS}$ by a single function may be difficult to determine, may not be effective due to modeling errors, or may be difficult to implement because of the model's complexity and computational cost. Thus, to approximate the changes in the relationship, the relationship between the compensated open circuit battery voltage and the state of charge can be approximately modeled by a piecewise linear equation. In other words, a plurality of linear equations are used to model the relationship. Linear equations can be evaluated with low computational costs. Moreover, accuracy can be improved by using additional linear equations. At least one embodiment uses a piecewise linear function that has been determined through experimental measurements, as indicated by the curve of FIG. 6.

The particular linear function that is selected for a particular calculation can depend on the state of charge. For example, the linear function to be used for determining the state of charge for a calculated compensated open circuit voltage $V_{OCS}$ can be selected based on testing whether the compensated open circuit voltage $V_{OCS}$ is within one of a number of ranges, wherein the ranges are based on past measurements of the state of charge. For further example, in one embodiment, the calculation circuit is configured to determine if the compensated open circuit voltage $V_{OCS}$ in the range of $V_{BAT10}$ and $V_{BAT60}$. As stated, $V_{BAT10}$ is compensated open circuit voltage $V_{OCS}$ determined experimentally to correspond to 10% state of charge and $V_{BAT60}$ is the open compensate voltage $V_{OCS}$ determined experimentally to correspond to 60% state of charge. If the compensated open circuit voltage $V_{OCS}$ is within that range, then a linear portion of the piecewise linear equation that corresponds to that range can be used to determine the state of charge based on the compensated open circuit voltage $V_{OCS}$. As stated, the piece-wise linear function can be produce by curve fitting experimental data, and data characterizing the piecewise linear function can be stored in the input registers 114 of the programmable interface 112, as shown in FIG. 1.

In one example embodiment, the relationship between the compensated open circuit battery voltage $V_{OCS}$ and the state of charge can be approximated by two linear functions over two separate domains. For example, the relationship between state of charge and the compensated open circuit voltage $V_{OCS}$ can vary with value of the compensated open circuit voltage $V_{OCS}$. For instance, the relationship can be approximated by a first linear function over the domain of $V_{OCS}<V_{BAT60}$, and can be approximated by a second liner function over the domain $V_{OCS}>V_{BAT60}$, where $V_{BAT60}$ is the open circuit battery voltage corresponding to 60% state of charge. In this case, $V_{BAT60}$ can be selected as the threshold. In another example, the relationship can be approximated by a first linear function over the domain or range of $V_{BAT10}<V_{OCS}<V_{BAT60}$, and can be approximated by a second liner function over the domain or range of $V_{BAT60}<V_{OCS}>V_{BAT90}$, where $V_{BAT10}$ is the open circuit battery voltage corresponding to 10% state of charge and $V_{BAT90}$ is the open circuit battery voltage corresponding to 90% state of charge. In this case, the values $V_{BAT10}$, $V_{BAT60}$, and $V_{BAT90}$ can be used as three thresholds. Accordingly, in such an embodiment, if the test $V_{OCS}<V_{BAT60}$ passes (and, if appropriate, $V_{OCS}>V_{BAT10}$), then the method proceeds to block 410. Otherwise, the method 400 continues to block 412 (and, if appropriate, $V_{OCS}<V_{BAT90}$). In one embodiment, a calculation circuit can be used to test the compensated open circuit battery voltage $V_{OCS}$, such as shown in the example of FIG. 1.

The method 400 can include block 410 for calculating a state of charge of the battery using the first equation if the condition of block 408 is satisfied. For instance, the calculation circuit can be configured to generate the estimate of the state of charge based on the first linear relationship if the adjusted open voltage measurement is less than a predetermined threshold. In one embodiment, the first linear function can correspond to the following equation:

$$SoC = \frac{60\% - 10\%}{V_{BAT60} - V_{BAT10}}(V_{OCS} - V_{BAT10}) + 10\% \qquad \text{(Eq. 1)}$$

In Equation 1, the quantity $V_{BAT10}$ can correspond to a constant representing an open circuit battery voltage that corresponds to 10% state of charge. In one embodiment, the calculation circuit can be used to evaluate the first equation, such as shown in the example of FIG. 1.

The method 400 can include block 412 for calculating a state of charge of the battery using a second equation if the test of block 408 failed. For instance, the calculation circuit can be configured to generate the estimate of the state of charge based on the second linear relationship if the adjusted open voltage measurement is greater than the predetermined threshold. In one embodiment, the first linear function can correspond to the following equation:

$$SoC = \frac{90\% - 60\%}{V_{BAT90} - V_{BAT60}}(V_{OCS} - V_{BAT60}) + 10\% \qquad \text{(Eq. 2)}$$

In Equation 2, the quantity $V_{BAT90}$ can correspond to a constant representing an open circuit battery voltage that corresponds to 90% state of charge. In one embodiment, the calculation circuit can be used to evaluate the second equation, such as shown in the example of FIG. 1.

The method 400 can include block 414 for providing the state of charge. In one embodiment, the calculation circuit can provide the estimate of the state of charge state of charge to a programmable interface, such as shown in the example of FIG. 1.

Figure 5:
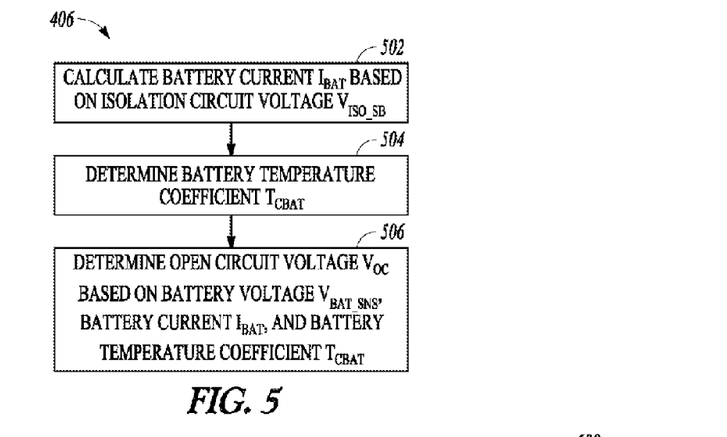
FIG. 5 is process flow diagram of an example embodiment of a method for determining a compensated open circuit voltage of the battery of the power system of FIG. 1.

FIG. 5 is process flow diagram of an example embodiment of a method 406 for determining a compensated open circuit voltage $V_{OCS}$ of a battery of the power system of FIG. 1. At block 502, the method 406 calculates the supply current $I_{BAT}$ based on the isolation circuit voltage $V_{ISO\_SB}$. As stated, the isolation circuit voltage $V_{ISO\_SB}$ can be measured by measuring the voltages at the nodes ISO_S and ISO_B of the battery gauge and based on the on-resistance $R_{ON}$ of the isolation circuit. In particular, the supply current $I_{BAT}$ can be estimated in accordance with the following equation:

$$I_{BAT} = (V_{ISO\_B} - V_{ISO\_S}) \div R_{ON} \qquad (\text{Eq. 3})$$

In Equation 3, the voltages $V_{ISO\_B}$ and $V_{ISO\_S}$ can be measured, as stated. The on-resistance $R_{ON}$ can correspond to the resistance of the isolation circuit, which may be provided by a programmable interface or provided as a factory programmed value.

At block 504, the method 406 determines the battery temperature coefficient $T_{CBAT}$. Battery temperature variations can negatively impact the accuracy of the fuel gauge reading. Accordingly, some embodiments estimate the battery temperature coefficient $T_{CBAT}$ in order to compensate for temperature variations. The battery temperature can be obtained via a voltage level $V_{THR}$ of a NTC resistor (e.g., $R_T$ of FIG. 1) output inside the battery pack. The voltage $V_{THR}$ can be mapped to pre-characterized temperature coefficients so that the battery internal resistance value can be adjusted to improve load compensation. The temperature coefficients can be obtained during operation by hardware or software implemented equations or look-up tables.

At block 506, the method 406 can determine the compensated open circuit voltage $V_{OCS}$ based on the measurement of the battery voltage $V_{BAT\_SNS}$, the estimated battery load current $I_{BAT}$, and the estimated battery temperature coefficient $T_{CBAT}$. In one embodiment, the compensated open circuit voltage $V_{OCS}$ can be estimated in accordance with the following equation:

$$V_{OCS} = V_{BAT\_SNS} + R_{IN} \times T_{CBAT} \times I_{BAT} \qquad (\text{Eq. 4})$$

In equation for, the voltage $V_{BAT\_SNS}$ can be measured, as stated. The resistance RIN can correspond to the internal resistance of the battery, which may be provided by a programmable interface or provided as a factory programmed value. The term $R_{IN} \times T_{CBAT} \times I_{BAT}$ can represent the adjustment made to the measured supply voltage.

FIG. 6 is plot 600 of example embodiments of linear functions of state of charge versus battery open circuit voltage. The plot 600 illustrates the state of charge of a battery as a function of battery open circuit voltages for various temperatures. The battery state of charge is represented by the vertical axis. The battery open circuit voltage is represented by the horizontal axis. Lines 602, 604, and 606 represent measurements of the state of charge at 0 C, 25 C, and 40 C, respectively. The line 608 is a piecewise linear function that has been generated to approximate the lines 602, 604, 608. As shown, line 608 has a nonlinearity point when it has a state of charge of 60%. For the battery open circuit voltages before this point, the line 608 is linear and that portion can represent the first linear equation. For the battery open circuit voltages after this point, the line 608 is also linear and that portion can represent the second linear equation.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A device to determine a state of a battery, the device comprising:
   first and second nodes, the first node being configured to receive a supply current and a supply voltage from the battery;
   one or more transistors configured to provide a resistance between the first and the second node, the one or more transistors being configured to conduct the supply current between the first node and the second node, thereby generating a voltage between the first node and the second node;
   a measurement circuit configured to measure the voltage generated between the first node and the second node, the measurement circuit being further configured to measure the supply voltage; and
   a calculation circuit configured to:
      generate an estimate of the supply current based at least on the voltage measured between the first node and the second node and the resistance of the one or more transistors;
      generate an adjusted voltage measurement based on the measured supply voltage, the estimate of the supply current, and an estimate of a temperature coefficient of the battery, and
      generate an estimate of the state of charge of the battery based at least on the adjusted voltage measurement.

2. The device of claim 1, further comprising an integrated circuit including the one or more transistors, the measurement circuit, and the calculation circuit.

3. The device of claim 2, wherein the integrated circuit is further configured to charge the battery by conducting a charging current from the second node to the first node via the one or more transistors.

4. The device of claim 1, wherein the measurement circuit is further configured to measure a second voltage of the battery, the second voltage indicative of a temperature characteristic of the battery, the calculation circuit being configured to generate the estimate of the state of charge based at least further on the second voltage of the battery.

5. The device of claim 4, wherein the measurement circuit comprises a temperature monitoring circuit configured to generate the estimate of the temperature coefficient of the battery based on the measured second voltage.

6. The device of claim 5, wherein the calculation circuit is further configured to generate the estimate of the state of charge based on a first linear relationship between the adjusted voltage measurement and the state of charge.

7. The device of claim 6, wherein the calculation circuit is further configured determine whether the adjusted voltage measurement is within a first range of a plurality of ranges of battery voltages associated with corresponding state of charges, the calculation circuit being further configured to generate the estimate of the state of charge based on the first linear relationship if the calculation circuit determines that the adjusted voltage measurement is within the first range.

8. The device of claim 7, wherein the plurality of ranges includes the first range and a second range, the first range corresponding to a first baseline battery voltage and a second baseline battery voltage, the second range corresponding to the second baseline battery voltage and a third baseline battery voltage, the first baseline battery voltage corresponding to a first state of charge derived from experimental data, the second baseline battery voltage corresponding to a second state of charge derived from experimental data, the third baseline battery voltage corresponding to a third state of charge derived from experimental data.

9. The device of claim 7, further comprising:
   a data storage device configured to store data, the data including a plurality of voltages indicative of at least the first range of the plurality of ranges,
   wherein the calculation circuit comprises a logic circuit configured to:
      retrieve the data from the data storage device;
      determine whether the adjusted voltage measurement is within the first range based on the data retrieved from the data storage device; and
      generate the estimate of the state of charge based on the first linear relationship if the logic circuit determines that the adjusted voltage measurement is within the first range.

10. The device of claim 1, wherein the measurement circuit comprises an analog-to-digital converter (ADC), the ADC configured to selectively measure the voltage between the first node and the second node, the ADC further configured to selectively measure the supply voltage.

11. The device of claim 1, wherein the one or more transistors are configured to conduct the supply current with a variable amount of resistance.

12. The device of claim 11, wherein the one or more transistors include first and second transistors operatively coupled in parallel between the first and second nodes, wherein the first and second transistors are configured to activate independently.

13. The device of claim 12, wherein the second transistors is configured to active when the supply current is less than a predetermined threshold.

14. The device of claim 1, further comprising one or more data registers configured to store the estimate of the state of charge.

* * * * *